United States Patent
Swift et al.

Patent Number: 5,220,481
Date of Patent: Jun. 15, 1993

[54] COMPOSITE TO ENABLE CONTACT ELECTROSTATIC VOLTAGE SENSING

[75] Inventors: Joseph A. Swift, Ontario; Alan J. Werner, Jr., Rochester, both of N.Y.

[73] Assignee: Xerox Corporation, Stamford, Conn.

[21] Appl. No.: 795,563

[22] Filed: Nov. 21, 1991

[51] Int. Cl.$^5$ .................. H01R 39/24; G03G 13/02
[52] U.S. Cl. ........................ 361/225; 310/251; 355/118
[58] Field of Search .............. 355/219, 210, 118, 301, 355/302; 310/251; 361/225, 212, 220, 221, 214

[56] References Cited

U.S. PATENT DOCUMENTS

| | | | |
|---|---|---|---|
| 4,106,869 | 8/1978 | Buchheit | 355/3 |
| 4,149,119 | 4/1979 | Buchheit | 324/32 |
| 4,336,565 | 6/1982 | Murray et al. | 361/225 |
| 4,358,699 | 11/1982 | Wilsdorf | 310/251 |
| 4,455,078 | 6/1984 | Mukai et al. | 355/3 |
| 4,569,583 | 2/1986 | Robson et al. | 355/14 |
| 4,741,873 | 5/1988 | Fischer et al. | 264/225 |
| 4,761,709 | 8/1988 | Ewing et al. | 361/225 |
| 4,801,967 | 1/1989 | Snelling | 355/3 |

*Primary Examiner*—Todd E. DeBoer
*Assistant Examiner*—Aditya Krishnan
*Attorney, Agent, or Firm*—Oliff & Berridge

[57] ABSTRACT

A contact for use in contacting a moving photoreceptor surface, is formed from a structure (preferably a pultrusion) including a plurality of continuous strand fibers of high electrical resistance, and a thermally stable insulating component between the resistive fibers. The resistive fibers are configured to form a brush extending from the insulating component for contact with the photoreceptor surface. The resistance of the fibers is sufficiently high to reduce leakage of surface charges away from the photoreceptor and to provide a high resistance between adjacent fibers. The insulating component, which serves to interface the carbon filaments from each other and from a host polymer may comprise an organic compound, such as a polyimide composition, or may comprise an inorganic compound such as $Al_2O_3$ or water glass, and is thermally stable below about 1000° C. The host polymer, on the other hand volatilizes rapidly and cleanly upon direct exposure to laser energy.

30 Claims, 2 Drawing Sheets

COMPOSITE TO ENABLE CONTACT ELECTROSTATIC VOLTAGE SENSING

This invention relates to improvements in electrical contacts in general, and more particularly to improvements in brush type electrical contacts, and still more particularly to improvements in brush type surface contacts for contacting a surface on which an electrostatic charge is carried without substantially redistributing the electrostatic change. The invention also relates to improvements in electrostatic voltmeters, and to probes and photoreceptive surface contacts for use with such electrostatic voltmeters.

The invention has wide applications; however, as will become apparent, a preferred embodiment of the invention is particularly suitable for applications in electrostatographic reproducing machines. In a typical electrostatographic reproducing machine, a photoconductive insulating surface, often in the form of a moving belt, is uniformly charged and exposed to a light image from an original document. The light image causes the exposed or background areas to become discharged, and creates an electrostatic latent image on the surface corresponding to the image contained within the original document. Alternatively, a light beam such as a laser beam may be modulated and used to selectively discharge portions of the photoconductive surface to record the desired information thereon. The electrostatic latent image is made visible by developing the image with a developer powder, referred to in the art as toner, which may be subsequently transferred to a support surface such as paper to which it may be permanently affixed by the application of heat and/or pressure.

To insure optimum machine performance, adjustment or tuning of the various machine processing components, such as adjustment of the power input to a corona generating device, or adjustment of the voltage bias to magnetic brush developing apparatii, or the like, are made. These adjustments may be performed through the use of an electrostatic voltage measuring device, sometimes termed an electrometer, which measures the voltage on a photoreceptive surface within the machine, such as the surface of a belt on which the electrostatic charge representing the image to be reproduced is carried.

One of the main problems which now exists is the lack of an adequate contact by which the electrostatic charges on the photoreceptive surface can be established, for use, for instance, by the electrostatic voltmeter. If for example, a brush contact were to be used, ideally the net sum of all of the charges contacted by the brush would be integrated and transmitted by a common connection directly to the input of the electrostatic voltmeter. However, since all of the fibers in the typical brush are generally connected together, not only at the connection point but also at various other points along the lengths of the fibers, electrostatic charges can freely move from fiber to fiber and up and down the individual fibers at random, essentially rearranging the charge distribution on the photoreceptive surface. The undesired result of this "cross talk" mechanism of the brush and of the resulting charge redistribution is electrostatic image smearing. Smearing of the electrostatic image produces unacceptable variations in image density on the output copies which is a serious problem.

Although it is desired that the electrostatic voltmeter contact be continuously in contact with the photoreceptor, it can be seen that this goal is not acceptably achievable at the present time thorugh the use of such contacts in which the "cross talk" mechanisms exists.

It has been proposed to use a lift-off device to remove the contacting element of the electrostatic voltmeter from the photoreceptor at critical times in the electrostatic reproduction cycle, but this "removable-contact" approach is not very attractive, since it adds unnecessary cost and complexity to the machinery.

PRIOR ART

U.S. Pat. No. 4,358,699 to Wilsdorf describes an electrical fiber brush and method of making it. The fiber brush consists of a brush body of a matrix material, at least one fibrous part formed in the brush by removing most or all of the matrix material, at least one working surface which will make an electrical connection with some object(s) to which electrical connection shall be made, and at least one set of electrically conductive fiber wires which form a part of the working surface as well as of the fibrous part. The electrical properties of the brush are controlled by the fiber wires. By making extremely large numbers of fiber wires of very small diameters to contact the object at the working surface of the brush, quantum-mechanical tunneling is expected to become the predominant mechanism of current conduction, yielding extremely good brush performance, while at the same time brush wear is forecast to be very low.

U.S. Pat. No. 4,761,709 to Ewing et al. describes a contact brush charging device having a plurality of resiliently flexible thin fibers having a resistivity of from about $10^2$ ohms-cm to about $10^6$ ohm-cm and being substantially resistivity stable to changes in relative humidity and temperature. Preferably the fibers comprise partially carbonized polyacrylonitrile fibers.

U.S. Pat. No. 4,336,565 to Murray et al., assigned to the assignee of the present application, describes a charge process with a carbon fiber brush electrode. The process imposes an electric charge on an electrically insulating surface of a moving web by a brush electrode which contacts the surface. The brush is made up of extremely soft and flexible filaments comprising carbon mounted on a metallic brace serving as an electrical contact to supply the brush with DC potential.

U.S. Pat. No. 4,455,078 to Mukai et al. describes a charging device having a conductive particle impregnated strand lined contact member. The charging device comprises a contact piled cloth which is formed of pliable material and having an electrical resistance chosen to be $1 \times 10^8$ ohm-cm, and contacts with a photosensitive layer of a photosensitive drum. The contact piled cloth is provided with a multitude of raised furs formed of artificial fibers with conductive particles dispersed therein.

U.S. Pat. No. 4,741,873 to Fischer et al. describes a method for forming rigid composite preforms, providing a way for rigidizing the preform prior to resin or matrix introduction. The preforms are fabricated from reinforcement strands served with a thermoplastic thread. The reinforcement strands may be glass fibers or carbon fibers and the thermoplastic threads may be polyamides or other similar compounds.

U.S. Pat. No. 4,149,119 to Buchheit, assigned to the assignee of the present invention, describes an electrostatic voltmeter, or electrometer, that includes a probe sensor element for measuring charge on a test surface. The electrometer includes means to automatically neutralize changes in spacing between the electrometer probe and the surface being measured. The probe receives both AC and DC signals and is compensated for drift in the signals.

U.S. Pat. No. 4,801,967 to Snelling, assigned to the assignee of the present invention, describes a voltage sensor for sensing voltage on a photoreceptor surface. A wire electrode is placed parallel and across from a photoreceptor surface. Voltage is measured from the electrode and used in charging the photoreceptor to a uniform voltage level.

U.S. Pat. No. 4,106,869 to Buchheit, assigned to the assignee of the present invention, describes an electrostatic voltmeter with drift compensation.

U.S. Pat. No. 4,569,583 to Robson et al, describes an electrostatic charge probe for an electrophotographic apparatus.

SUMMARY OF THE INVENTION

In light of the above, therefore, it is an object of the invention to provide an improved electrical contact of the type described for use in electrostatic voltage sensing.

It is still another object of the invention to provide an electrical contact of the type described which can be used to contact electrostatic charge on a moving photoreceptive surface without substantially redistributing the charge.

It is yet another object of the invention to provide an electrical contact of the type described which can be used to sense electrostatic charge on a photoreceptor of an electrostatographic reproducing machine without electrostatic image smearing.

It is still yet another object of the invention to provide a electrical contact of the type described in which the "cross talk" mechanisms between the fibers of the device are reduced or eliminated.

It is yet another object of the invention to provide an electrical contact of the type described that can be allowed to remain continuously in contact with the photoreceptor, without substantially affecting the quality of the final copy image or of the photoreceptive surface.

It is yet another object of the invention to provide an improved electrical contact formed of a pultrusion composition, and a method of making same.

These and other objects, features, and advantages of the invention will be apparent to those skilled in the art from the following detailed description of the invention, when read in conjunction with the accompanying drawings and appended claims.

In accordance with a broad aspect of the invention, a contact is presented for such use as contacting a moving photoreceptor surface, and is formed of a structure including a plurality of continuous strand fibers of high electrical resistance, and a thermally stable insulating component between the resistive fibers. The resistive fibers are configured to form a brush extending from the insulating component for contact with the photoreceptor surface. The resistance of the fibers is sufficiently high to reduce leakage of surface charges away from the photoreceptor and to provide a high resistance between adjacent fibers. The insulating component, which serves to insulatively interface the carbon filaments from each other and from the host polymer may comprise an organic compound, such as a polyimide composition, or may comprise an inorganic compound such as $Al_2O_3$, and is thermally stable below about 1000° C.

The host polymer, on the other hand, thermally decomposes and volatilizes rapidly and cleanly upon direct exposure to the heat delivered by a laser. In a preferred embodiment, the structure is a pultrusion.

BRIEF DESCRIPTION OF THE DRAWINGS

The invention is illustrated in the accompanying drawings, in which.

In various figures, like reference numerals are used to denote like or similar parts. Also, the sizes and shapes of the various parts may have been drawn not to scale, exaggerated, and/or distorted for clarity of illustration and ease of description.

DETAILED DESCRIPTION OF THE PREFERRED EMBODIMENTS

In accordance with the present invention, an improved electrical contact device is provided that is of improved reliability, is of low cost and is easily manufacturable. The invention will be described with reference to a manufacturing process known generally as a pultrusion process, with the fibrillation of at least one end of the pultrusion. A structure formed by such a pultrusion process is referred to herein as a "pultrusion." However, structures other than a pultrusion are possible as long as the fibers are insulated from each other. For example, as will become more apparent from the description herein, the structure for holding the fibers may be heat shrunk tubing or any other mechanism for securing the fibers 11 together. Thus, while the invention is described with reference to a pultrusion, other structures are possible.

Figure 1:
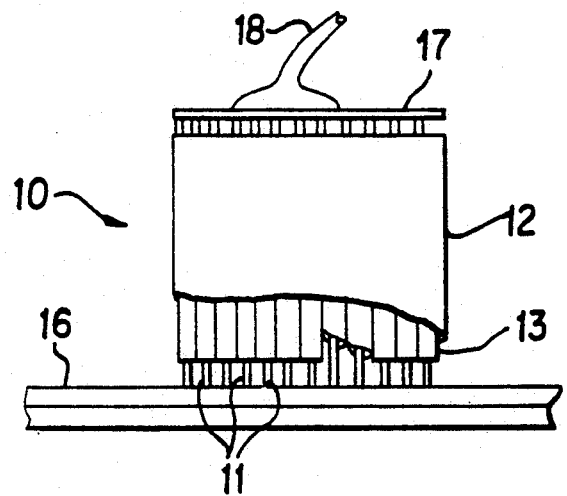
FIG. 1 is a side view, partially cut away, of a brush pultrusion contact in accordance with a preferred embodiment of the invention, in relation to a moving photoreceptor surface.

With reference now to FIG. 1, the pultrusion composition 10 in accordance with a preferred embodiment of the invention comprises continuous fibers or strands 11 of resistive carbon fiber filler within a host polymer 12, and within a thermally stable, insulating compound 13 that forms a continuous interfacial layer between the individual fibers 11 and the host polymer 12. The pultrusion composition 10 is shown in contact with a photosensitive surface 16 on one side, and a connection plate 17 on the other side to which electrical connection is established. Such carbon fiber pultrusions are a subcategory of high performance conductive composite plastics, and comprise one or more types of continuous, conductive reinforcing filaments in a binder polymer.

They provide a convenient way to handle, process and use fine diameter, carbon fibers without the problems typically encountered with free conductive fibers.

The pultrusion process generally consists of pulling continuous lengths of fibers first through a resin bath or impregnator, then into a performing fixture where the resulting section is at least partially shaped and excess resin and/or air removed. The section is then pulled into heated dies where it is continuously cured. For a detailed discussion of pultrusion technology, reference is directed to "Handbook of Pultrusion Technology" by Raymond W. Meyer, first published in 1985 by Chapman and Hall, New York.

More specifically, in the practice of the invention, conductive carbon fibers are submersed in a liquid polymer bath and drawn through a die opening of suitable shape at high temperature to produce a solid piece having dimensions and shapes of that imparted by the die. The solid piece can then be cut, shaped, and/or machined. As a result, a structure can be achieved that has thousands of fine diameter, conductive fiber elements contained within the polymer matrix, the ends of the fiber elements being exposed to provide a very large number of individual electrical contacts. The very large redundancy and availability of electrical contacts enables a substantial improvement in the reliability of these devices.

Since the plurality of small diameter conductive fibers are pulled through the polymer bath and heated die in continuous lengths, the shaped member can be formed with the fibers being continuous and generally collimated from one end of the member to the other. Accordingly, the pultruded composite may be formed in a continuous length during the pultrusion process, then cut to any suitable dimension, with a very large number of filamentary electrical contacts provided at each end. Such pultruded composite members may have either one or both of its ends subsequently fibrillated.

Any suitable fiber having a high resistance may be used in the practice of the invention. However, carbon fibers are particularly well suited as preferred fiber because they are small in size and supple, non-abrasive, chemically and environmentally inert, possess high strength and resilience, can be tailored to a wide range of resistivities, and exhibit a negative coefficient of thermal resistivity. The conductive fibers can be formed to have a DC volume resistivity of from about $1 \times 10^{-3}$ $\Omega.cm$ to about $1 \times 10^{10}$ $\Omega.cm$ and preferably from about $5 \times 10^8$ $\Omega.cm$ to about $5 \times 10^9$ $\Omega.cm$.

In addition, the individual conductive fibers 11 can be made circular in cross section with a diameter generally in the order of from about 4 micrometers to about 50 micrometers and preferably from about 7 micrometers to 10 micrometers. This provides a very high degree of fibrous contact redundancy in a small cross-sectional area. Thus, as contact materials, the fibers provide a multiple redundancy of contact points, for example, in the range between about $0.05 \times 10^5$ and $5 \times 10^5$ contacts/cm$^2$, preferably about $0.0558 \times 10^5$ contacts/cm$^2$. This is believed to enable extraordinarily high contact reliability. Moreover, for instance, in electrostatic reproducing machines, imbedding such fibers within a polymeric binders such as within a pultrusion is also likely to minimize harmful contamination effects from long lengths of broken fibers transported randomly within the machines.

The fibers 11 are typically flexible and compatible with the polymer systems within which they are imbedded. Typical fibers may include carbon, carbon/graphite, metalized or metal coated carbon fibers, carbon coated glass, surface carbonized polymeric or glass fibers, and metal coated glass fibers. A particularly preferred class of fibers that may be used are those fibers that are obtained from controlled heat treatment processing to yield complete or partial carbonization of polyacrylonitrile (PAN) precursor fibers. It has been found for such fibers that by carefully controlling the temperature of carbonization within certain limits that precise electrical resistivities for the carbonized carbon fibers may be obtained. The carbon fibers from polyacrylonitrile (PAN) precursor fibers are commercially produced by the Stackpole Company, Celion Carbon Fibers, Inc., division of BASF and others in yarn bundles of 1,000 to 160,000 filaments. The yarn bundles are generally carbonized in a two-stage process. The first stage involves stabilizing the PAN fibers at temperatures on the order of 300° C. in an oxygen atmosphere to produce preoxstabilized PAN fibers. The second stage involves carbonization of the fibers at elevated temperatures in an inert atmosphere, such as an atmosphere containing nitrogen. The DC electrical resistivity of the resulting fibers is controlled by the selection of the time and temperature of carbonization. For example, carbon fibers having an electrical resistivity of from about $10^6$ $\Omega.cm$ to $10^{10}$ $\Omega.cm$ are obtained if the carbonization temperature is controlled in the range of from about 500° C. to about 1000° C. For further reference to the processes that may be employed in making these carbonized fibers attention is directed to U.S. Pat. No. 4,761,709 to Ewing et al and the literature sources cited therein at column 8.

The carbon fibers 11 are enclosed in any suitable polymer matrix 12. (If the structure is not a pultrusion, then the fibers can be secured by heat shrunk tubing instead of the host polymer 12.) The polymer matrix should be of a resin binder material that will volatilize rapidly and cleanly upon direct exposure to the laser beam during laser processing below described. While thermosetting polymers such as vinyl ester, polyester, and epoxies are in general use for pultrusions and are acceptable for use in this invention, thermal plastic polymers such as low molecular weight polyethylene, polypropylene, polystyrene, polyvinylchloride, nylon, polyphenylene sulfide, and polyurethane may be particularly advantageously employed.

Between the carbon fibers and the host polymer is an interfacial compound 13. The interfacial compound 13 has a high insulating resistivity as well as a high thermal stability, for instance, having the ability to withstand temperatures of 200° C. to beyond 500° C. which can be created by a laser during the fibrillation process. The high thermal stability is necessary to enable laser or other thermal processing operations to be performed without volatilizing the interfacial compound or decomposing it to a conductive moiety. The interfacial compound 13 also has good compatibility with the host polymer 12 to enhance polymer-to-fiber adhesion where this may be required. Accordingly, the interfacial compound 13 can be an organic compound, such as polyimide, poly ether ether ketone (PEEK), polytetrafluoroethylene (teflon), polybenzimidolimide (PBI), Kevlar, hydrofluoro elastomers (e.g. Viton GF), or other high temperature, film forming- organic polymeric compounds. Alternatelly, insulative, inorganic compounds, such as, for example, aluminum oxide (Al$_2$O$_3$), synthetic diamond, water glass (e.g. potassium silicate or lithium silicate), or any other insulative, film-forming compound may be suitably adapted for application in this invention.

Either organic or inorganic type interfacial compounds can be applied directly to the fiber by solution, immersion or other solution coating techniques, by thermal, coating techniques from the melted compound(s), or from any other suitable coating technique.

A laser (not shown) can be used to cut individual components for use as electrical contacts or specifically the charge pick-up contact in accordance with the present invention. For example, a focused CO$_2$ laser can be used to cut the pultrusion and simultaneously volatilize the binder resin in a controlled manner a sufficient distance back from the cut to produce in one step the distributed filament contact illustrated in FIG. 1. The length of exposed carbon fiber can be controlled by the laser power and cut rate. Various tip shapes can be achieved by changing the laser incidence angle. Thus, a suitable protrusion can be cut by laser techniques to form a contact 10 of desired length from the longer pultrusion length, and both severed ends can be fibrillated to provide a high redundancy fiber contact member downstream to contact the photosensitive surface 16 and a high redundancy fiber contact upstream to contact the contact plate 17. Any suitable laser can be used which has suitable light energy to be absorbed by the matrix of the host polymer 12, so that the host polymer 12 will be volatilized. Specific lasers which may be used include a carbon dioxide laser, a carbon monoxide laser, or the YAG laser. The carbon dioxide laser is particularly suited for this application, owing to the fact that it is highly reliable, highly compatible for efficient light to heat conversion by polymer matrix absorption, and is most economical in manufacturing environments.

As mentioned, a preferred embodiment of the invention provides a high resistance electrode element. This element enables a contacting electrostatic voltmeter to be useful to continuously measure the electrostatic charge on the photoreceptive surface 16. That is, a contact member 10, formed as described above in accordance with a preferred embodiment of the invention can be used to contact the moving photoreceptive surface 16 for continuously measuring the voltage or electrostatic charge thereon.

Figure 2:
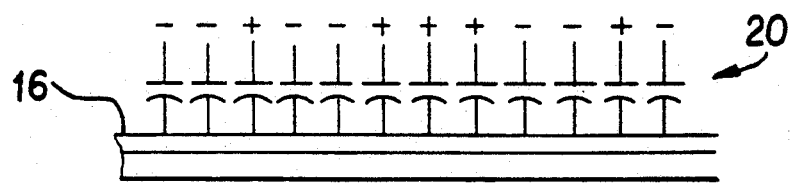
FIG. 2 is a side view representation of the photoreceptor of FIG. 1, showing an equivalent electrical circuit of the electrical characteristics of an electrostatic charged photoreceptor.
Figure 3:
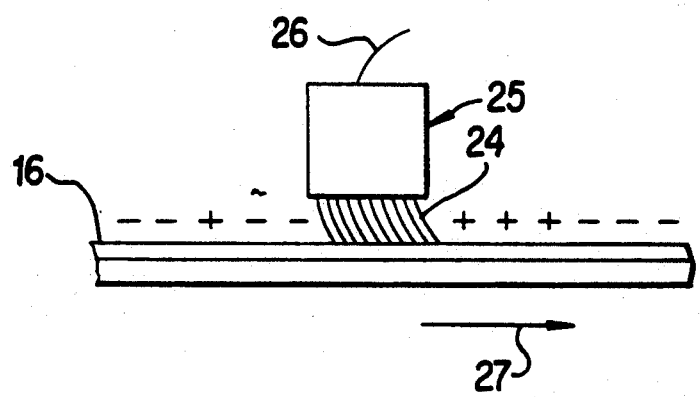
FIG. 3 is a side view representation of the photoreceptor and its surface charge of FIG. 2, in contact with a resistive brush consisting of of isolated resistive fibers projecting from a pultruded brush contact element.

For a complete understanding of the benefits afforded by the contact of the invention, the mechanism for electrostatic image smear by a contacting element will now be described. As shown in FIG. 2, an electrostatically charged photoreceptor surface 16 can be viewed as a distributed capacitor presenting a plurality of parallel configured capacitors 20, each charged to a charge value determined by the degree to which the light image to which it has been exposed has caused the particular capacitor areas to become discharged via photodischarge of the previously uniformly charged photoconductor. A brush-like contacting member, for example, of a tip fibrillated pultrusion 25, shown in FIG. 3 may be made up of thousands of 7 to 10 micron diameter fibers 24. Each of the fibers 24 is continuous in length and has a finite, relatively high, resistance. At any instant during movement of the photoreceptor surface 16 under the brush 25, as indicated by the arrow 27, the tip of every fiber 24 contacts a different area of the photoreceptor surface 16, in effect contacting a different capacitor. In the absence of a suitable interfacial layer 13 of FIG. 1, all of the fibers 24 in the pultrusion 25 of FIG. 3 are connected together, not only at the common connection 26, but also at various other points along the lengths of the fibers via the fiber to fiber resistance 30. Here, charges can freely move from fiber to fiber and up and down the fibers at random. It is this charge transfer or "cross talk" mechanism via electrical contact between fibers that is believed to be the cause for electrostatic image smearing.

Figure 4:
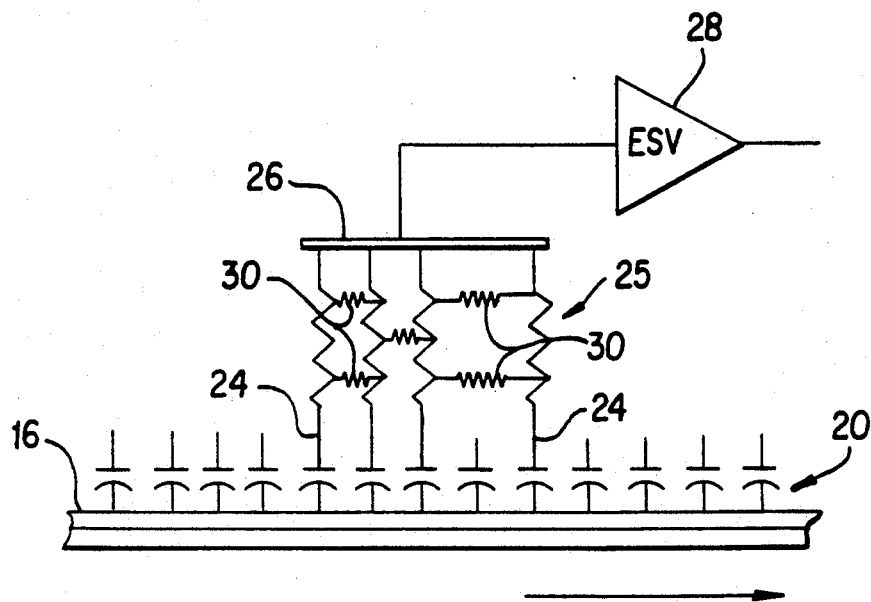
FIG. 4 is a side view representation of the photoreceptor and contacting brush of FIGS. 1 and 3 and the equivalent electrical circuit, used in conjunction with an electrostatic voltmeter (i.e. ESV)
Figure 5:
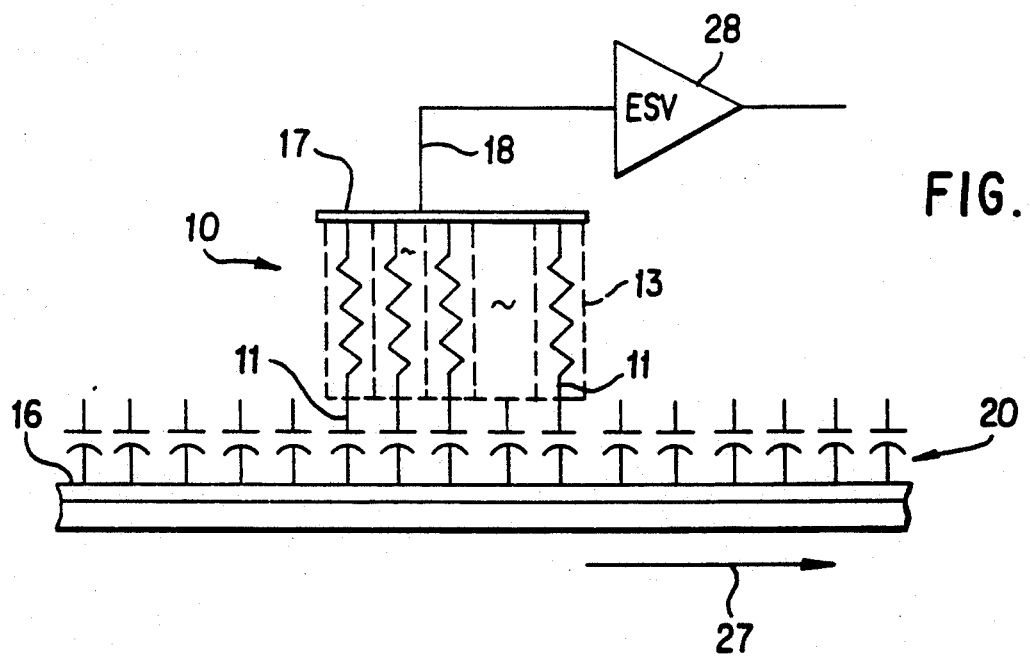
FIG. 5 is a side view representation of the photoreceptor and its equivalent electrical circuit of FIG. 2, in relation to an equivalent circuit of resistive fibers of a pultruded brush contact element used in conjunction with an electrostatic voltmeter, in accordance with a preferred embodiment of the invention.

Under ideal operation, the net sum of all of the charges contacted by the brush 25 is integrated and transmitted by a common connection 26 directly to the input of an electrostatic voltmeter 28, as shown in FIG. 4. Since if according to a preferred embodiment of the invention, each fiber is isolated from all of the other fibers along their entire lengths by the interfacial layer 13, as illustrated in an equivalent electrical circuit in FIG. 5, electrostatic image smear can be reduced or eliminated. Thus, the charge moved by any individual fiber tip 11 must travel along that same fiber to the common connection 17 and back down to the surface 16 of the photoreceptor in order to redistribute any of the charge in the original pattern on the photoreceptor surface. As the photoreceptor surface 16 moves under the brush, in the direction shown by the arrow 27 each fiber 11 contacts a specific region on the photoreceptor for a finite, but very short length of time. If the resistance of the individual fibers 11 is properly selected (for any given photoreceptor capacitance and velocity), then the time constant of the charge traveling from the photoreceptor surface 16 through a single fiber 11 and back down via another adjacent fiber 15 in FIG. 1 to the photoreceptor surface 16 is sufficiently long so that no significant amount of charge can be transferred while the fiber 11 is over any one point. Consequently no image smear occurs.

Although the invention has been described and illustrated with a certain degree of particularity, it is understood that the present disclosure has been made only by way of example, and that numerous changes in the combination and arrangement of parts or materials can be resorted to by those skilled in the art without departing from the spirit and scope of the invention as hereinafter claimed.

We claim:

1. A surface contact for contacting a photoreceptor surface without substantially disturbing an electrostatic charge thereon, comprising:
    a plurality of continuous strand fibers having a DC volume resistivity of at least $1 \times 10^8$ Ω.cm, and
    a thermally stable insulating component between said resistive fibers to eliminate charge transfer between fibers along their respective lengths,
    said resistive fibers being configured to form a brush extending from said insulating component for contact with said photoreceptor surface at one end, and interconnected at an opposite end to enable charge to be removed from said resistive fibers.

2. The photoreceptor surface contact of claim 1 wherein the structure is a pultrusion.

3. The photoreceptor surface contact of claim 1 wherein the resistance of said fibers is sufficiently high to reduce leakage of surface charges away from said photoreceptor surface.

4. The photoreceptor surface contact of claim 1 further comprising a host polymer carrying said plurality of continuous strand fibers and said thermally stable insulating component.

5. The photoreceptor surface contact of claim 4 wherein said insulating component comprises an organic compound.

6. The photoreceptor surface contact of claim 5 wherein said organic compound is a polyimide composition.

7. The photoreceptor surface contact of claim 4 wherein said insulating component comprises an inorganic compound.

8. The photoresistive surface contact of claim 7 wherein said insulating component is $Al_2O_3$.

9. The photoreceptor surface contact of claim 1 wherein said thermally stable insulating component has a thermal stability below about 1000° C.

10. The photoreceptor surface contact of claim 4 wherein said host polymer is of a material which will volatilize rapidly and cleanly upon direct exposure to a laser beam of predetermined energy.

11. The photoreceptor surface contact of claim 10 wherein said host polymer comprises a polymer selected from the group consisting of low molecular weight polyethylene, polypropylene, polystyrene, polyvinylchloride, nylon, polyphenylene sulfide, and polyurethane.

12. The photoreceptor surface contact of claim 1 wherein said continuous strand fibers are carbon fibers.

13. The photoreceptor surface contact of claim 1 wherein the resistance of said resistive fibers is between about $1 \times 10^8$ Ω.cm and about $1 \times 10^9$ Ω.cm 14. The photoreceptor surface contact of claim 1 wherein the resistance of said resistive fibers is about $5 \times 10^8$ Ω.cm.

15. The photoreceptor surface contact of claim 2 wherein said pultrusion is of rectangular shape.

16. The photoreceptor surface contact of claim 15 wherein said rectangular shape is of dimensions of about 0.8 mm × 6.0 mm.

17. The photoreceptor surface contact of claim 14 wherein said plurality of continuous strand fibers have a density of about 36,000 fibers/in².

18. The photoreceptor surface contact of claim 2 wherein said pultrusion is of round shape.

19. The photoreceptor surface contact of claim 18 wherein said round shape is of dimensions of about 3.0 mm diameter.

20. The photoreceptor surface contact of claim 1 wherein said pultrusion is of tubular round shape.

21. The photoreceptor surface contact of claim 20 wherein said tubular round shape is of dimensions of about 6.0 mm outside diameter × 5.0 mm inside diameter.

22. The photoreceptor surface contact of claim 10 wherein said host polymer comprises a polymer selected from the group consisting of vinyl ester, polyester, and epoxy.

23. The photoreceptor surface contact of claim 4 wherein said structure is a pultrusion and said pultrusion is mounted as a component directly onto a wire leaded, conductive connecting plate.

24. The photoreceptor surface contact of claim 4 wherein said structure is a pultrusion and said pultrusion is mounted as a component directly onto a wire leaded, conductive connecting plate encased within a non-conductive holder assembly.

25. The photoreceptor surface contact of claim 4 wherein said structure is a pultrusion and said pultrusion is mounted as a component directly onto a printed wiring circuit board.

26. The photoreceptor surface contact of claim 24 wherein said non-conductive holder assembly is of molded plastic.

27. The photoreceptor surface contact of claim 7 wherein said insulating component is sodium silicate.

28. A surface contact for contacting a photoreceptor surface without substantially disturbing an electrostatic charge thereon made by the process of:
    performing a pultrusion process to form a structure having a plurality of continuous strand fibers, each having a high electrical resistance and a thermally stable insulating component between said resistive fibers to provide a high electrical resistance between adjacent fibers; and
    fibrillating an end to form a brush extending from said insulating component for contact with said photoreceptor surface.

29. The surface contact of claim 28 wherein said step of performing a pultrusion process comprises forming a structure having a plurality of continuous strand fibers each having a DC volume resistivity of between about $1 \times 10^{-3}$ Ωcm and $1 \times 10^{10}$ Ωcm.

30. The surface contact of claim 28 wherein said step of performing a pultrusion process comprises forming a structure having a plurality of continuous strand fibers each having a DC volume resistivity of between about $5 \times 10^8$ Ωcm and $5 \times 10^9$ Ωcm.

* * * * *